United States Patent [19]

Komatsu et al.

[11] 4,451,844
[45] May 29, 1984

[54] POLYSILICON EMITTER AND BASE CONTACTS SEPARATED BY LIGHTLY DOPED POLY SEPARATOR

[75] Inventors: Shigeru Komatsu, Yokohama; Michio Nakamura, Kawasaki, both of Japan

[73] Assignee: Tokyo Shibaura Denki Kabushiki Kaisha, Kawasaki, Japan

[21] Appl. No.: 289,961

[22] Filed: Aug. 4, 1981

[30] Foreign Application Priority Data

Aug. 20, 1980 [JP] Japan .................. 55-114211

[51] Int. Cl.³ ............... H01L 23/50; H01L 23/52
[52] U.S. Cl. ......................... 357/59; 357/34; 357/50; 357/58; 357/65
[58] Field of Search .............. 357/59, 68, 65, 89, 357/90, 50, 58

[56] References Cited

U.S. PATENT DOCUMENTS

| | | | |
|---|---|---|---|
| 3,728,590 | 4/1973 | Kim et al. | 357/59 |
| 4,031,608 | 6/1977 | Togei et al. | 357/59 |
| 4,074,304 | 2/1978 | Shiba | 357/59 |
| 4,161,745 | 7/1979 | Slob | 357/68 |

FOREIGN PATENT DOCUMENTS

| | | | |
|---|---|---|---|
| 2670 | 7/1979 | European Pat. Off. | 357/59 R |
| 55-134962 | 10/1980 | Japan | 357/59 R |

Primary Examiner—William D. Larkins
Attorney, Agent, or Firm—Finnegan, Henderson, Farabow, Garrett & Dunner

[57] ABSTRACT

A semiconductor device comprising a semiconductor substrate of an N conductivity type; an insulation layer of a predetermined pattern for selectively covering the substrate; a first region of a P conductivity type formed in that area of the substrate which is surrounded by the insulation layer; a second region of the P+ conductivity type having a high impurity concentration and formed in the first region; a third region of the N conductivity type formed in the first region; a polycrystalline silicon layer formed on the major surface of the substrate, said polycrystalline silicon layer comprising a first portion of the P conductivity type contacting the second region, a second portion of the N conductivity type contacting the third region and a third portion contacting the first region, said first and second portions constituting first and second contacting electrodes, respectively, and the third portion having a predetermined impurity concentration and constituting a separation portion for insulating the first and second portions from each other.

5 Claims, 13 Drawing Figures

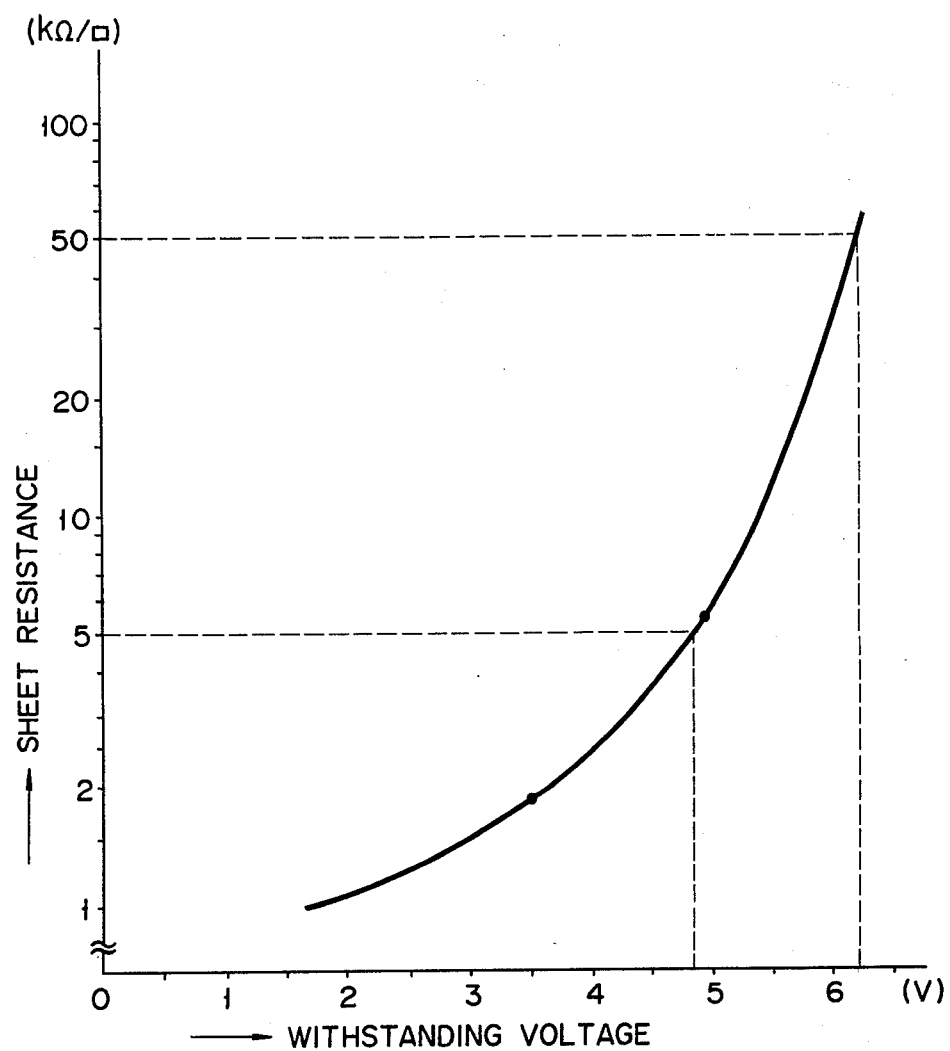

F I G. 6
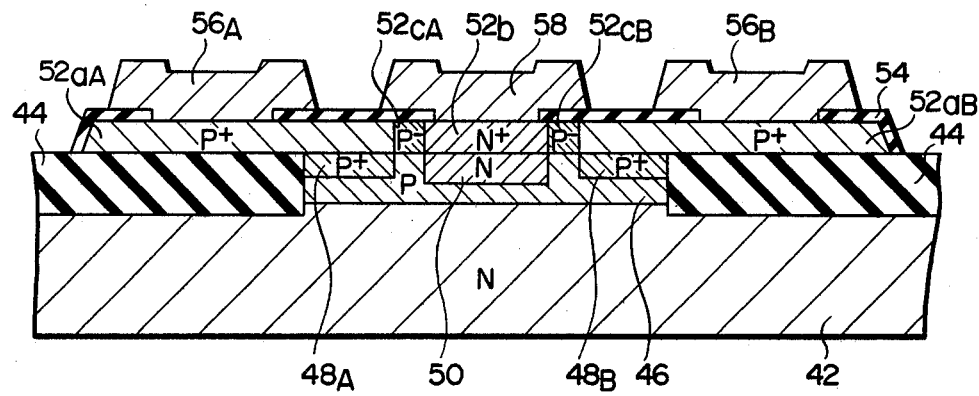
F I G. 7
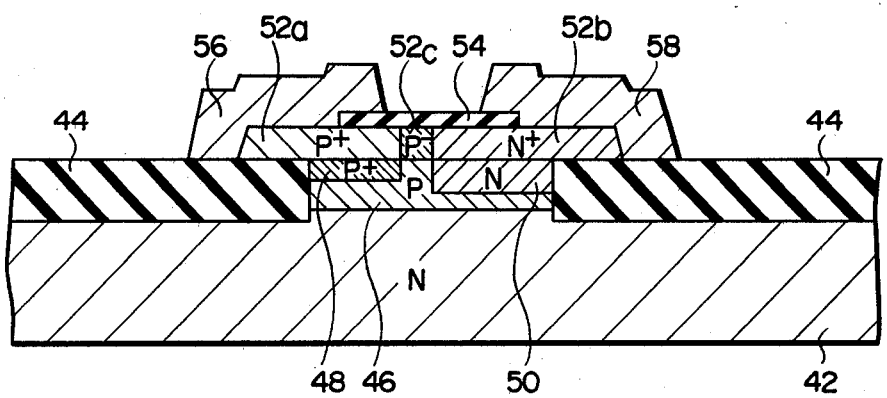

POLYSILICON EMITTER AND BASE CONTACTS SEPARATED BY LIGHTLY DOPED POLY SEPARATOR

BACKGROUND OF THE INVENTION

This invention relates to a semiconductor device for improving the accuracy of a high speed operation and high frequency operation.

A conventional semiconductor device has been proposed which realizes the microminiaturization of its size using a polycrystalline silicon layer as a contacting electrode to a metal electrode.

FIG. 1 shows one form of such a conventional semiconductor device. In the semiconductor device as shown in FIG. 1 an insulating film 14 of a predetermined pattern is formed in an embedded fashion in a semiconductor substrate 12 of, for example, an N conductivity type. A P-type region 16 is formed in that portion of the substrate 12 which is surrounded with the insulation film 14, and acts as a base region. A high impurity concentration P+-type region 18 and N-type region 20 are separately formed in the P-type region 16, the P+type region 18 acting as a high concentration base region and the N type region 20 acting as an emitter region. A base contacting electrode 22 and emitter contacting electrode 24 are formed on the P+base region 18 and N emitter region 20, respectively, and formed of a polycrystalline silicon layer, the base contacting electrode and emitter contacting electrode partly extending onto the insulation film 14. An insulation film 26 made of, for example, SiO$_2$ is formed on that portion of the insulating film 14 where no base contacting electrode 22 and emitter contacting electrode 24 are formed, the insulating film 26 and insulating film 14 being formed to overlap each other. The base contacting electrode 22 and emitter contacting electrode 24 are insulated from each other by an insulation film 26a. A base metal electrode 28 and emitter metal electrode 30 made of, for example, aluminium are formed on the base contacting electrode 22 and emitter contacting electrode 24, respectively.

In the conventional semiconductor device as shown in FIG. 1, the base contacting electrode 22 and emitter contacting electrode 24 are separated by the insulating film portion 26a. In order to obtain a normal operation of the semiconductor device, the insulating film portion 26a permits a complete insulation between the base contacting electrode 22 and the emitter contacting electrode 24. However, the polycrystalline silicon layer, of which the base contacting electrode 22 and emitter contacting electrode 24 are made, is formed normally by an epitaxial growth method and, for each semiconductor wafer from which substrates are formed, there is normally a greater variation in the thickness of a polycrystalline silicon layer. The insulating film 26 including the insulating film portion 26a is formed by, for example, thermally oxidation-treating predetermined portions of the above-mentioned polycrystalline silicon layer including the base contacting electrode 22 and emitter contacting electrode 24. Where there is a variation in the thickness of a polycrystalline silicon layer on each semiconductor wafer, it is necessary to adjust the oxidation time for forming the insulating film 26 for each wafer. Thus, an operation efficiency is lowered. Where the oxidation time is too short, no oxidation treatment is performed over the whole thickness of the polycrystalline layer, there being the case where the electrode 22 cannot be completely insulated from the electrode 24. In order to obtain a complete insulation, it is necessary to exactly adjust the oxidation time. Since, after the formation of the P-type region 16, the polycrystalline silicon layer is formed and then the heat treatment step for forming the insulating film portion 26a is effected, the diffusion of an impurity in the P-type region 16 proceeds. At a subsequent step, the N-type emitter region 20 is formed to act as a transistor element, thus making the diffusion depth of the P-type region 16 greater. As a result, there arises a problem that no sufficient high-speed operation and high-frequency operation are obtained in the conventional semiconductor device.

SUMMARY OF THE INVENTION

An object of this invention is to provide a semiconductor device which can attain a sufficient high-speed operation and high-frequency operation by enhancing the accuracy of a separation between electrode regions in a polycrystalline layer.

According to this invention, there is provided a semiconductor device comprising a semiconductor substrate of a first conductivity type; an insulation layer of a predetermined pattern for selectively covering the substrate; a first region of a second conductivity type formed in that area of the substrate which is defined by the insulating layer; a second region of a second conductivity type formed in the first region; a third region of the first conductivity type formed in the first region; a polycrystalline layer formed on the major surface of the substrate; said polycrystalline silicon layer comprising a first portion of the second conductivity type contacting the second region, a second portion of the first conductivity type contacting the third region and a third portion contacting the first region, said first and second portions constituting first and second contacting electrodes, respectively, and the third portion having a predetermined impurity concentration and constituting a separation portion for insulating the first and second portions from each other.

BRIEF DESCRIPTION OF THE DRAWINGS

FIG. 4 is a characteristic curve showing a relation of the sheet resistivity of a separation region of a semiconductor device in FIG. 2 to the reverse withstanding voltage of a PN junction in the polycrystalline silicon layer;

FIGS. 6 and 7 are views showing another embodiment of a semiconductor device of this invention.

DETAILED DESCRIPTION OF THE PREFERRED EMBODIMENTS

Figure 1:
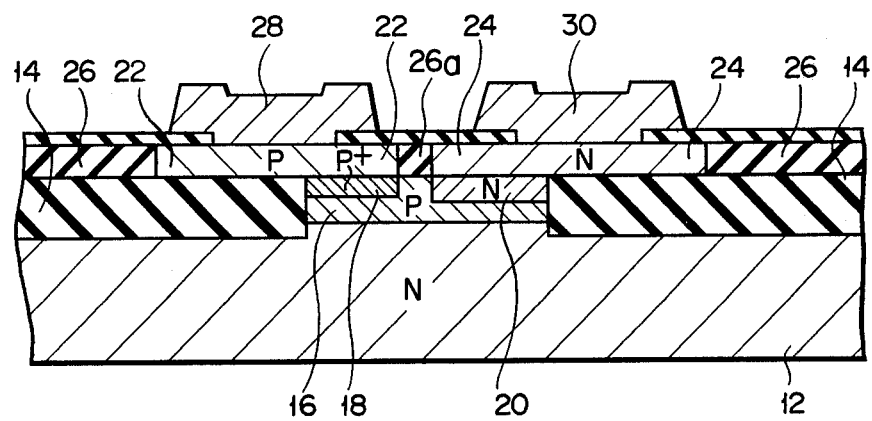
FIG. 1 shows one form of a conventional semiconductor device using a polycrystalline silicon layer as a contacting electrode to a metal electrode.

The embodiments of this invention will be explained below by referring to the drawings.

Figure 2:
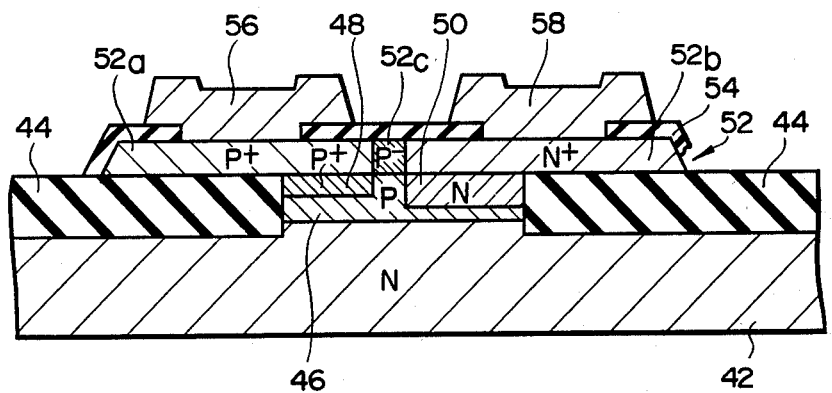
FIG. 2 shows one embodiment of a semiconductor device according to this invention, in which a polycrystalline silicon layer is used as a contacting electrode.

FIG. 2 is a cross-sectional view showing one embodiment of a semiconductor device of this invention. Reference numeral 42 shows an N-conductivity type semiconductor substrate having a sheet resistivity of, for example, about 0.2 to 0.3 Ω·cm. An insulating film 44 of a predetermined pattern which is made of, for example, $SiO_2$ is formed in the substrate 42 such that it is embedded therein. A P-conductivity type region 46 is formed in that portion of the substrate 42 which is surrounded by the insulating film 44, and serves as a base region. The P-type base region 46 has a junction depth Xj of about 0.3 to 0.5 μm and sheet resistivity $ρ_s$ of about 300 Ω/□ to 2 KΩ/□. A high impurity concentration P+-type base region 48 and N-type emitter region 50 separately formed in the P-type base region 46. A polycrystalline silicon layer 52 of a predetermined pattern is formed on the exposed surfaces of the insulating film 44, P-type base region 46, high concentration P+ type base region 48 and N type emitter region 50. A P-type impurity is injected in high impurity in that portion of the polycrystalline silicon layer 52 overlying the P+ type base region 48 and that portion of the insulating layer 44 adjacent to the P+ type base region 48. The P+ type polycrystalline silicon layer 52 serves as a base contacting electrode 52a having a sheet resistivity of about 100 to 500 Ω/□. An N-type impurity is injected in high concentration into that portion of the polycrystalline silicon layer 52 overlying the N-type emitter region 50 and that portion of the insulating film 44 which contacts with the N-type emitter region 50. The resultant high concentration region constitutes an emitter contacting electrode 52b having a sheet resistivity of about 20 to 100 Ω/□. A P-type impurity, for example, is injected in low concentration into that portion of the polycrystalline silicon layer 52 which is situated between the P+ type base region 48 and the N emitter region 50 and which corresponds to the exposed surface of the P-type base region 46. The resultant low concentration region constitutes a separation region 52c having a sheet resistivity of about 5 to 50 KΩ/□. The width of the separation region 52c as measured between the electrode 52a and the electrode 52b is about 2 to 4 μm. An insulating film 54 made of, for example, $SiO_2$ is formed on the whole surface of the polycrystalline silicon layer 52 and has a predetermined pattern of contacting holes. For ease in understanding, an insulating film on the inclined portion of the end of the right side of the polycrystalline silicon layer 52, though omitted, is formed, like the inclined portion of the end of the left side of the polycrystalline silicon layer 52, such that it extends onto the insulating film 44. A base metal electrode 56 and emitter metal electrode 58 made of, for example aluminium are formed on the base contacting electrode 52a and emitter contacting electrode 52b respectively through the contacting holes of the insulating film 54.

Figure 3:
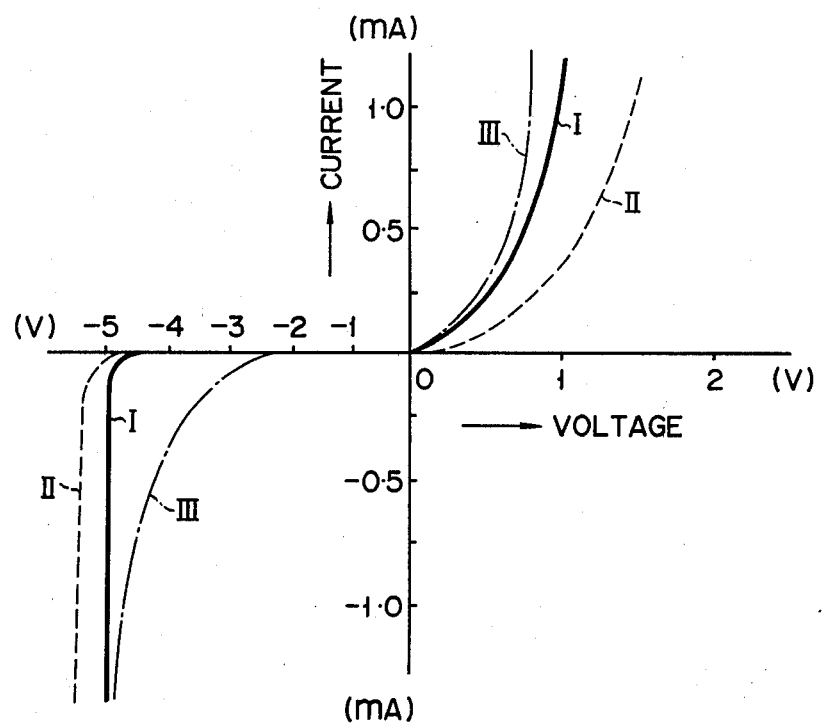
FIG. 3 shows a voltage V-current I characteristic curve of the semiconductor device shown in FIG. 2.

The forward and reverse voltage V-current I characteristics of the semiconductor device so formed were found out, indicating a sharp rise in the first and third quadrants, as indicated by the curve I in FIG. 3, on the two-dimensional coordinates, as well as a desirable V-I characteristic (indicated by the solid lines) having a very large reverse withstanding voltage. This means that, if the sheet resistivity of the separation region 52c is about 5 to 50 KΩ/□, an adequate insulation effect is obtained between the electrode 52a and the electrode 52b.

As evident from FIG. 3, the reverse withstanding voltage has a greater value of about −4.7 V. In the semiconductor device as shown in FIG. 2 the reverse withstanding voltage is substantially determined by the reverse withstanding voltage of a PN junction between the P-type separation region 52c and the N+ type emitter contacting electrode 52b. Upon examination of a relation of the PN junction between the P type separation region 52c and the N+ emitter contacting electrode 52b to the sheet resistivity of the P-type separation region 52c of the semiconductor device of FIG. 2 it has been found that a characteristic as shown in FIG. 4 is obtained. From the characteristic curves of FIG. 4 it has been found that as the sheet resistivity of the P-type separation region 52c becomes greater the reverse withstanding voltage becomes greater and that in a sheet resistivity range of about 5 KΩ/□ to 50 KΩ/□ the reverse withstanding voltage shows a great value of about 4.8 to 6.2 V. From this it has been accepted that the sheet resistivity of the P-type separation region 52c is determined preferably in a range of about 5 KΩ/□ to 50 KΩ/□. The P-type separation region 52c comprised of the polycrystalline silicon layer between the electrodes 52a and 52b provides a better V-I characteristic and great reverse withstanding voltage. Here, the P-type separation region 52c is not restricted to the P conductivity type as in this embodiment. As such separation region use may be made of an N conductivity type. In this case, it is only necessary that the sheet resistivity be about 5 KΩ/□ to 50 KΩ/□. Note that, in this case, the reverse withstanding voltage of the device is substantially determined by the reverse withstanding voltage on the PN junction between the N separation region and the P+ region 52a. Since the polycrystalline silicon layer 52 has a high sheet resistivity of about 5 KΩ/□ to 50 KΩ/□, if the base contacting electrode 52a was not made at a high concentration, the characteristic curve was affected as indicated by the curve II in FIG. 3 due to the application of the resistance components to the forward and reverse V-I characteristics. That is, the reverse withstanding voltage was somewhat improved in comparison with the case of the curve I, but the forward characteristic showed a slight rise.

Where a high concentration impurity was injected into the whole region of the polycrystalline silicon layer 52, the sheet resistivity of the P-type separation region 52c was lowered to a value (i.e. about 100 Ω/□ to 500 Ω/□) the same as the sheet resistivity of the base contacting electrode 52a. As indicated by the characteristic curve III in FIG. 3 the forward characteristic was improved, but the reverse characteristic showed a very gentle breakdown and the reverse withstanding voltage was reduced to about 2.4 V as indicated by the dot-dash lines.

From this it has been confirmed that the base contacting electrode 52a and emitter contacting electrode 52b need to be formed as high concentration impurity regions and that the P-type separation region 52c needs to be formed as a low concentration impurity region of a sheet resistivity of about 5 KΩ/□ to 50 KΩ/□.

The manufacture of the semiconductor device of FIG. 2 will be explained below by referring to FIGS. 5A to 5G.

Figure 5A:
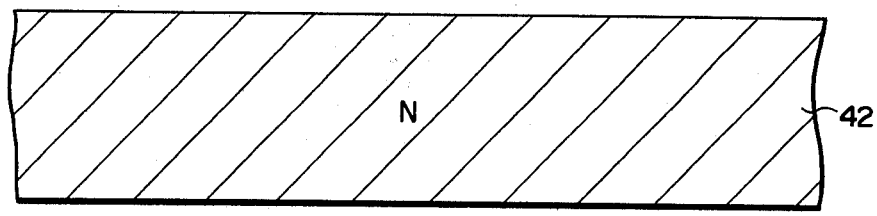
FIGS. 5A to 5G are views showing the steps of manufacturing the semiconductor device of FIG. 2.
Figure 5B:
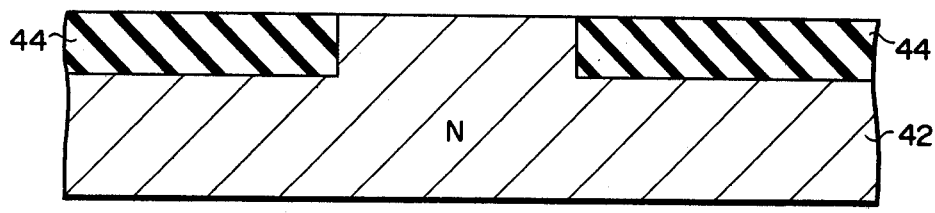
Figure 5C:
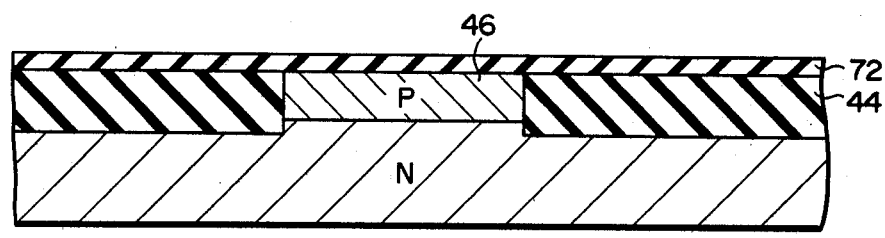
Figure 5D:
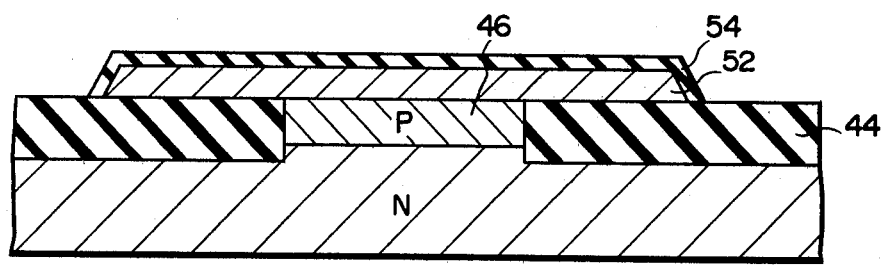
Figure 5E:
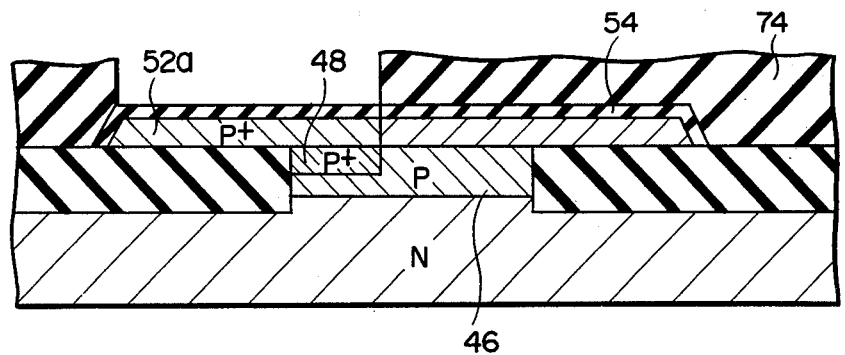
Figure 5F:
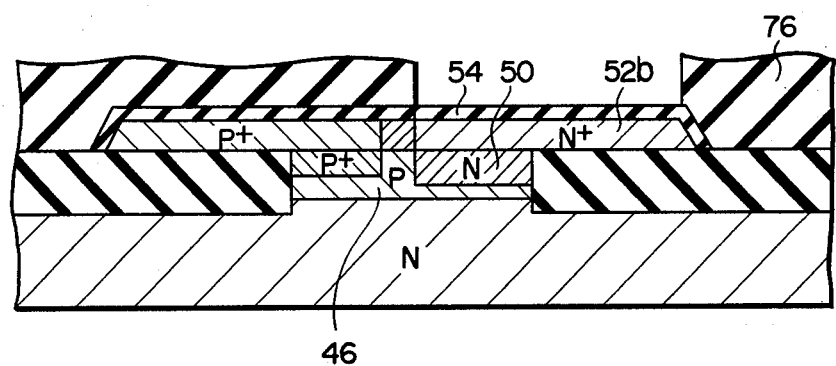
Figure 5G:
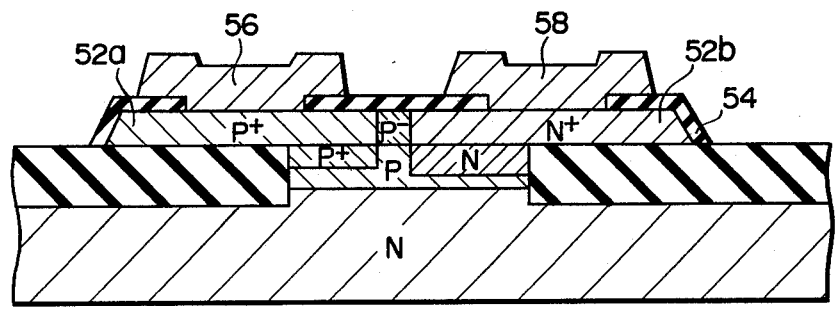

As shown in FIG. 5A, a semiconductor substrate 42 of an N conductivity type is prepared, which is made of, for example, silicon and which has a sheet resistivity of about 0.2 to 0.3 Ω·cm. An insulating film 44 of a predetermined pattern is formed by a selective oxidation technique in the substrate 42, as shown in FIG. 5B. As shown in FIG. 5C, an oxide film 72 with a thickness of about 1000 Å is formed by, for example, a thermal oxidation treatment method on the whole substrate surface including the surface of the insulating film 44. Boron, for example, is injected as a P-type impurity into that area of the substrate defined by the oxide film 44, the dose of impurity being about $1.0 \times 10^{14}/cm^2$ to $4.0 \times 10^{14}/cm^2$ at acceleration voltage of about 40 KeV. Then, the area of the substrate is heat-treated at a temperature of about 900° C. to 1000° C. to form a P-type region 46 having a junction depth Xj of about 0.3 to 0.5 μm and sheet resistance of about 300 Ω/□ to 2 KΩ/□. After the oxide film 72 is removed, the structure is inserted into an LPCVD (Low Pressure Chemical Vapor Deposition) tube of a diffusion reactor type and silane (SiH4) is thermally decomposed at about 600° C. to 700° C. in the LPCVD tube to epitaxially form an about 3000±200 Å-thick polycrystalline silicon layer on the surface of the oxide film 44 and P-type region 46, followed by effecting patterning to form an about 3000±200 Å polycrystalline silicon layer 52 of a predetermined pattern as shown in FIG. 5D. An about 1000±50 Å-thick insulating film 54 of, for example, SiO2 is formed on the whole surface of the polycrystalline silicon layer 52 as indicated in FIG. 5D. The insulating film 54 may be formed by, for example, an epitaxial growth technique or formed by thermally oxidation-treating the surface of the silicon layer 52. A P-type impurity, for example, boron is injected from the whole surface of the insulating film 54 into the polycrystalline silicon layer 52 under the acceleration voltage of about 40 KeV and a dose of about $0.5 \times 10^{14}$ to $2.0 \times 10^{14}/cm^2$, followed by activation. After a photoresist film is coated on that surface of the structure which includes the insulating film 54, patterning is performed to remove that area on the insulating film 54 which corresponds to a base contacting electrode formation area. Then, a photoresist film 74 is formed as shown in FIG. 5E. A P-type impurity, for example, boron is injected into the base contacting electrode formation area under acceleration voltage of about 50 to 70 KeV and a dose of about $1 \times 10^{15}$ to $5 \times 10^{15}/cm^2$. After the photoresist film 74 is removed, the structure is heat-treated at about 900° C. to 1000° C. to form a sheet resistivity-reduced, high concentration P+-type base region 48 in that portion of the P type region 46, as shown in FIG. 5E, which contacts with the base contacting electrode formation area. At the same time, a high concentration P+ region 52a with a sheet resistivity of about 100 Ω/□ to 500 Ω/□ is formed in the base contacting electrode formation area of the polycrystalline silicon layer 52. After the photoresist film 74 is removed, a photoresist film is coated on that surface of the structure which includes the insulating film 54. Patterning is performed to remove that area on the insulating film 54 which corresponds to an emitter contacting electrode formation area of the polycrystalline silicon layer 52. As shown in FIG. 5F, a photoresist film 76 is formed and an N-type impurity, for example, phosphorus or arsenic is injected into the emitter contacting electrode formation area under acceleration voltage of about 200 KeV and a dose of about $0.5 \times 10^{14}$ to $2 \times 10^{16}/cm^2$. After the photoresist film 76 is removed, the structure is heat-treated at about 900° C. to 1000° C. to form an N emitter region 50 in the P-type region 46, as shown in FIG. 5F, which contacts with the emitter contacting electrode formation area. The emitter contacting electrode formation area of the polycrystalline silicon layer 52 is formed as a high concentration N+ region 52b having about 20 Ω/□ to 100 Ω/□. Contacting holes are formed at predetermined places in the insulating film 54. After aluminium, for example, is evaporated by a CVD (Chemical Vapor Deposition) method on the surface of the structure, patterning is performed to form metal electrodes 56 and 58 on the base contacting electrode 52a and emitter contacting electrode 52b, respectively, as shown in FIG. 5G. In this way, the semiconductor device as shown in FIG. 2 is manufactured.

FIG. 6 shows another embodiment of a semiconductor device of this invention. This embodiment is of a double-base type. The structure as shown in FIG. 6 is basically similar to the embodiment of FIG. 2, except that base regions are formed one at each side of an emitter region, as shown in FIG. 6, with the emitter region at the center. Thus, a detailed explanation is omitted. In the embodiment shown in FIG. 6, the same reference numerals are employed to designate elements corresponding to those shown in the embodiment of FIG. 2. Suffixes A, B are attached to reference numerals in FIG. 6 as used to designate the emitter region in the embodiment shown in FIG. 2.

FIG. 7 shows another embodiment of this invention. In the embodiment of this invention, the base electrode 56 and emitter electrode 58 are formed such that they surround a polycrystalline silicon layer 52 with the base electrode 56 and emitter electrode 58 extending onto an insulating film 44. In this embodiment, the same reference numerals are employed to designate elements corresponding to those shown in the embodiment of FIG. 2. Thus, a detailed explanation is therefore omitted.

Even in the embodiments of FIGS. 6 and 7, the same effect as in embodiment of FIG. 2 is obtained.

This invention is not restricted to the above-mentioned embodiment. Although in the above-mentioned embodiment explanation is made of the type in which the oxide film 44 is embedded in the substrate 42, it does not need to be done necessarily so. It is only necessary to cover a predetermined portion of the substrate 42. The substrate, though indicated by the N conductivity type, may be of a P-type. In this case, the conductivity type of each region is reversed. In the N-type substrate, use may be made of an N-type epitaxial layer on a P-type substrate. The sheet resistivity of the N-type substrate 42 is indicated as being, for example, about 0.2 to 0.3 Ω·cm, but this is explained in connection with a reference value in the case of a high-speed transistor of a low-withstanding voltage type. When a high-speed transistor of a high-withstanding voltage type is involved, the sheet resistivity of the substrate is, for example, about 1.0 to 2.0 Ω·cm. Since the base contacting electrode and emitter contacting electrode are separated by the separation area which is formed by injecting a predetermined amount of impurity, it is possible to enhance separation accuracy between the contacting electrodes. This permits a high-speed operation and high-frequency operation with high accuracy.

What we claim is:

1. A semiconductor device comprising:
   a semiconductor substrate of a first conductivity type;
   an insulation layer of a predetermined pattern for selectively covering the substrate;
   a first region of a second conductivity type formed in that area of the substrate which is defined by the insulation layer;
   a second region of the second conductivity type having a high impurity concentration and formed in the first region;
   a third region of the first conductivity type formed in the first region; and a polycrystalline silicon layer formed on the major surface of the substrate, said polycrystalline silicon layer comprising a first portion of the second conductivity type contacting the second region, a second portion of the first conductivity type contacting the third region and a third portion contacting the first region, said first and second portions having high impurity concentrations constituting first and second contacting electrodes, respectively, and the third portion having a low impurity concentration and constituting a separation portion for insulating the first and second portions from each other.

2. A semiconductor device according to claim 1, wherein the first region has a sheet resistivity of about 300 $\Omega/\square$ to 2 $K\Omega/\square$.

3. A semiconductor device according to claim 1, wherein said first and second portions have sheet resistivites of about 100 $\Omega/\square$ to 500 $\Omega/\square$ and about 20 $\Omega/\square$ to 100 $\Omega/\square$, respectively, and said third portion has a sheet resistivity of about 5 $K\Omega/\square$ to 50 $K\Omega/\square$.

4. A semiconductor device according to claim 1, wherein said third portion is of the first conductivity type.

5. A semiconductor device according to claim 1, wherein the third portion is of the second conductivity type.

* * * * *